(12) United States Patent
Selva et al.

(10) Patent No.: US 8,977,513 B2
(45) Date of Patent: Mar. 10, 2015

(54) RELIABILITY TEST WITH MONITORING OF THE RESULTS

(75) Inventors: Carolina Selva, Cologno Monzese (IT); Cosimo Torelli, Cassina de Pecchi (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 703 days.

(21) Appl. No.: 12/904,358

(22) Filed: Oct. 14, 2010

(65) Prior Publication Data

US 2011/0087453 A1   Apr. 14, 2011

(30) Foreign Application Priority Data

Oct. 14, 2009  (IT) ............................... MI2009A1765

(51) Int. Cl.
   *G01R 31/00*   (2006.01)
   *G01R 31/3193* (2006.01)
   *G01R 31/28*   (2006.01)

(52) U.S. Cl.
   CPC ...... *G01R 31/31935* (2013.01); *G01R 31/2856* (2013.01)
   USPC ........................................................ 702/117

(58) Field of Classification Search
   CPC .................... G01R 31/2856; G01R 31/31935
   USPC .............. 714/30; 702/57, 117, 130, 179, 189; 324/750.3
   See application file for complete search history.

(56) References Cited

U.S. PATENT DOCUMENTS

| | | | |
|---|---|---|---|
| 7,571,363 B2* | 8/2009 | Wallace et al. ................ | 714/724 |
| 2004/0181724 A1 | 9/2004 | McBride | |
| 2006/0132167 A1* | 6/2006 | Chen ............................. | 324/765 |
| 2007/0018677 A1 | 1/2007 | Marr | |
| 2008/0092003 A1 | 4/2008 | Khoche et al. | |

OTHER PUBLICATIONS

Search Report based on Italian Application Serial No: MI20091765, Ministero dello Sviluppo Economico, Munich, Jun. 1, 2010, pp. 3.

* cited by examiner

*Primary Examiner* — Elias Desta
(74) *Attorney, Agent, or Firm* — Gardere Wynne Sewell LLP

(57) ABSTRACT

An electronic device for executing a reliability test. Such an electronic device includes a circuit for implementing a functionality of the electronic device, and testing circuit for executing a test of the functional circuit including a plurality of test operations on the functional circuit. The testing circuit returns an indication of a result of each test operation. In an embodiment, the electronic device further includes control circuit for causing the testing circuit to reiterate the test, monitoring circuit for monitoring the result of each test operation to detect a failure of the test operation, and storage circuit for storing failure information indicative of temporal characteristics of each failure.

31 Claims, 4 Drawing Sheets

RELIABILITY TEST WITH MONITORING OF THE RESULTS

PRIORITY CLAIM

The instant application claims priority to Italian Patent Application No. MI2009A001765, filed Oct. 14, 2009, which application is incorporated herein by reference in its entirety.

TECHNICAL FIELD

An embodiment relates to the test field. More specifically, such an embodiment relates to reliability tests.

BACKGROUND

Electronic devices—such as integrated circuits (for example, non-volatile memories)—are generally subject to a functional test to verify their correct operation; this may be of the utmost importance to ensure a high quality of a production process of the electronic devices. For such purpose, some electronic devices are provided with a BIST (Built-In Self Test) machine being implemented within the electronic device; such BIST machine is capable of self-performing the functional test of the electronic device and outputting its result.

Furthermore, the functional test may be supported by a conditioning procedure, which subjects the electronic devices to be tested to stress conditions for simulating a long period of operation in standard conditions; in such way, the functional test being performed by the BIST machine on an electronic device subject to the conditioning procedure implements a reliability test, which is used for identifying potential defects in the electronic device (that is, that may occur after a certain period of use).

The conditioning procedure of the electronic devices may be of thermal type, as in the case of a burn-in reliability test, which consists of having the electronic devices operate at very high or very low temperatures (for example, from −50° C. to +150° C.); otherwise, the conditioning procedure of the electronic devices may be of both thermal and voltage type, as in the case of an OLT (Operating Life Test) reliability test.

In general, the reliability test is performed by having the electronic devices operate continuously (for example, for about 1,000 hours) in a conditioning machine that subjects the electronic devices to variable conditions of temperature and/or voltage (for example, by causing the functional test to be executed cyclically by their BIST machines without detecting the result). At the end of such conditioning procedure, the electronic devices are provided to a verification machine in which they are again subject to the same functional test (being performed by their BIST machines), in order to detect the defective electronic devices.

However, such reliability test may have some drawbacks that preclude its use on a large scale.

First of all, in the present state of the art, defective electronic devices may be identified only at the end of the reliability test (in the verification machine), because the conditioning machine may be incapable of detecting the results provided by the BIST machines. However, in this way no information is available about the particular temperature conditions and/or voltage conditions wherein each defect manifested itself (in the conditioning machine).

Moreover, the power consumption of the electronic devices may not be minimized, substantially for two reasons. Firstly, at the end of the conditioning procedure it may be necessary to perform an additional functional test by the BIST machines, with consequent waste of electric power (as well as time). Secondly, since each BIST machine performs the functional test on all the chips included in the corresponding electronic device indiscriminately for the whole (long) duration of the conditioning process, there may also be a waste of processing power, since all the integrated circuits are typically always tested (including the ones being already detected as defective in a previous functional test).

SUMMARY

An embodiment is based on the idea of monitoring a test result.

More specifically, an embodiment is an electronic device. The electronic device includes functional means for implementing a functionality of the electronic device (for example, a bank of non-volatile memories). The electronic device further includes testing means (for example, a BIST machine) for executing a test of the functional means, which test includes a plurality of test operations on the functional means (for example, each one for testing a non-volatile memory); the testing means returns an indication of a result of each test operation. In an embodiment, the electronic device further includes control means (for example, a microprocessor) for causing the testing means to reiterate the test. Monitoring means is provided for monitoring the result of each test operation to detect a failure of the test operation; moreover, storage means is provided for storing failure information indicative of temporal characteristics of each failure (for example, a progressive number of the corresponding test operation).

Another embodiment is a test apparatus for executing a reliability test on such electronic devices.

A different embodiment is a corresponding method for executing a reliability test.

Another embodiment is a program for allowing a microcontroller of the electronic device to perform such method.

A further embodiment is a complex system including one or more of such electronic devices.

BRIEF DESCRIPTION OF THE DRAWINGS

One or more embodiments, as well as features and the advantages thereof, will be best understood with reference to the following detailed description, given purely by way of a non-restrictive indication, to be read in conjunction with the accompanying drawings (wherein corresponding elements are denoted with equal or similar references, and their explanation is not repeated for the sake of exposition brevity). In this respect, it is expressly intended that the figures are not necessarily drawn to scale and that, unless otherwise indicated, they are simply used to conceptually illustrate the described structures and procedures. In particular.

DETAILED DESCRIPTION

Figure 1:
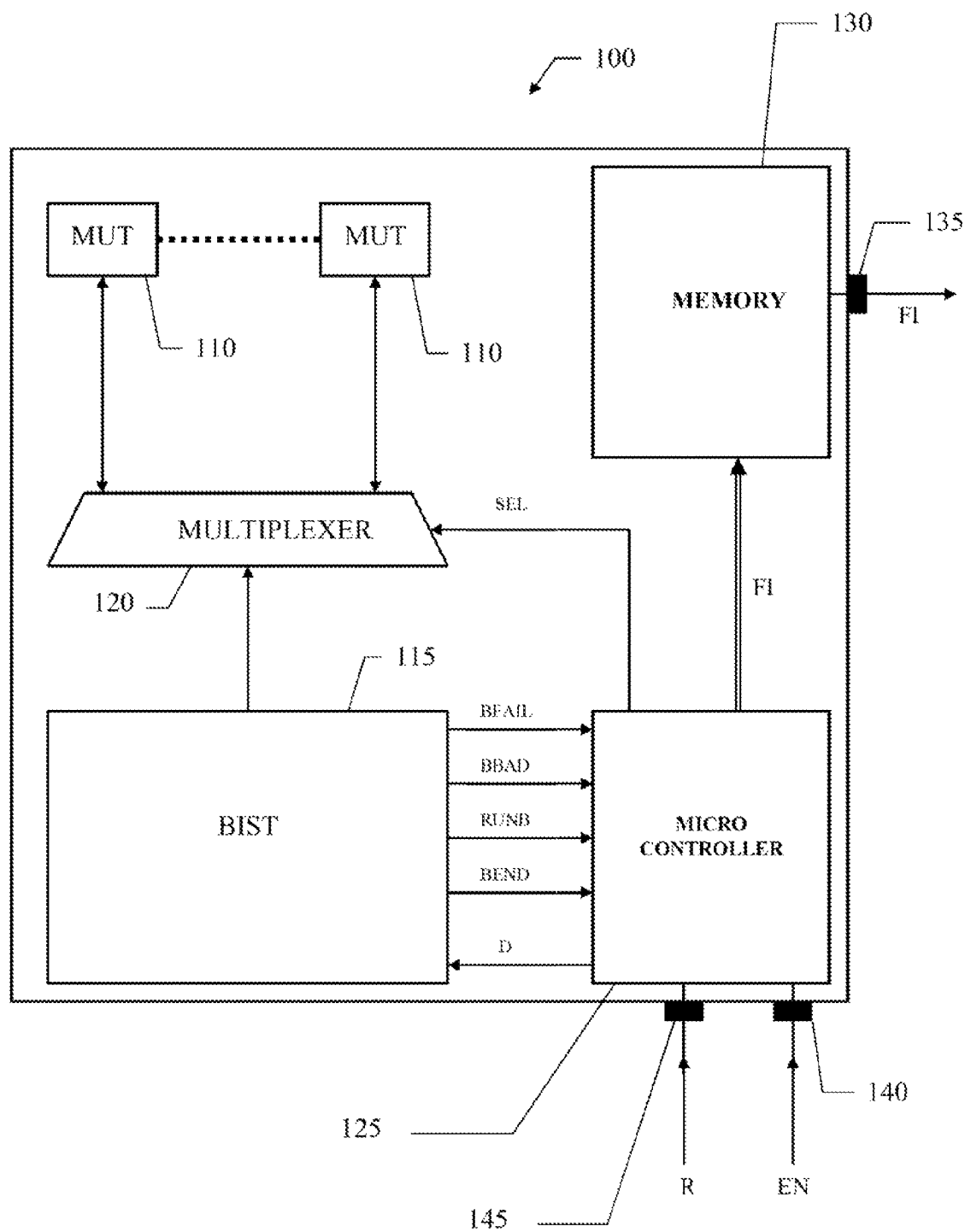
FIG. 1 is a schematic representation of an electronic device according to an embodiment.

With reference in particular to FIG. 1, there is shown a schematic representation of an electronic device 100 according to an embodiment.

The device 100 is integrated in a chip of semiconductor material (typically embedded in a suitable package). The electronic device 100 includes a plurality of (volatile or non-volatile) memory elements to be tested (or simply "MUTs", Memories Under Test) 110. The electronic device 100 also includes a BIST test machine 115, which is coupled with each MUT 110 through a multiplexer 120. The multiplexer 120 also receives a selection signal SEL, which enables the connection of the BIST machine 115 with a selected MUT 110 (corresponding to the value of the signal SEL).

The BIST machine 115 has an input terminal adapted to receive an enabling signal D of a test operation on a corresponding selected MUT 110, so that a functional test is obtained when all the MUTs 110 to be tested are subject to the same test operation; it is noted that several cycles (i.e., repetitions or reiterations) of functional tests (in the following, being referred to as test cycles for simplicity) are typically provided during long test procedures (for example, a reliability test), and hereinafter reference will be made to such an exemplary scenario. The BIST machine 115 also has four output terminals adapted to provide signals being indicative of a result of the test operation. In particular, a pulse signal BFAIL provides a pulse in response to the detection of a failure of the selected MUT 110, and a signal BBAD provides a voltage step in response to that failure (that is, the signal BBAD is the triggered version of the signal BFAIL); moreover, a counting signal RUNB provides a progressive number of the test operations being performed by the BIST machine 115, and a status signal BEND indicates the end of each run of the test operation.

According to an embodiment, the electronic device 100 also includes a microcontroller 125 and an auxiliary non-volatile memory (hereinafter, for simplicity, only referred to as memory) 130.

The microcontroller 125 interfaces with the BIST machine 115, to which it provides the signal D for controlling the execution of the test operations provided for the functional test and from which it receives the signals BFAIL, BBAD, RUNB and BEND for monitoring the result of the test operations. The microcontroller 125 also provides the signal SEL to the multiplexer 120 (for selecting the MUT 110 on which the test operation has to be executed).

The microcontroller 125 also interfaces with the memory 130 for storing timing information about any failure of a corresponding MUT 110 (for example, the number of the test operation that has caused the failure as indicated by the signal RUNB).

The memory 130 communicates with the outside through an output pin 135 of the electronic device 100, which is used for serially reading (for example, through the IEEE JTAG protocol) failure information (FI) being contained therein (with respect to the failed test operations).

The microcontroller 125 receives an enable signal EN from the outside (for example, with the same modalities of the IEEE TAP Standard being commonly used for controlling the BIST machine) at an input pin 140 of the electronic device 100 to activate the execution of the test operations on the MUTs 110, and a read signal R at a further input pin 145 of the electronic device 100 for activating the reading of the failure information Fl from the memory 130 (from the output pin 135).

An embodiment allows obtaining information about the particular conditions in which each failure has occurred. For example, the above-described failure information allows determining (from the number of test operation that has caused the failure of each MUT) the specific conditions of temperature and/or voltage in which the test operation of the MUT has failed. In such way, a failure analysis (for identifying the causes and devising possible solutions) is greatly facilitated.

Moreover, such embodiment does not need further functional test any longer after the conditioning procedure (for identifying the defective electronic devices); this results in a corresponding saving of electric power and time.

An embodiment may be advantageous since it maintains the number of pins of the electronic device limited; in fact, the pins being added for the signals EN, R and Fl are compensated for by the removal of the pins for the signals D, BFAIL, BBAD, RUNB and BEND (which are now managed within the electronic device by the microcontroller 125).

Figure 2:
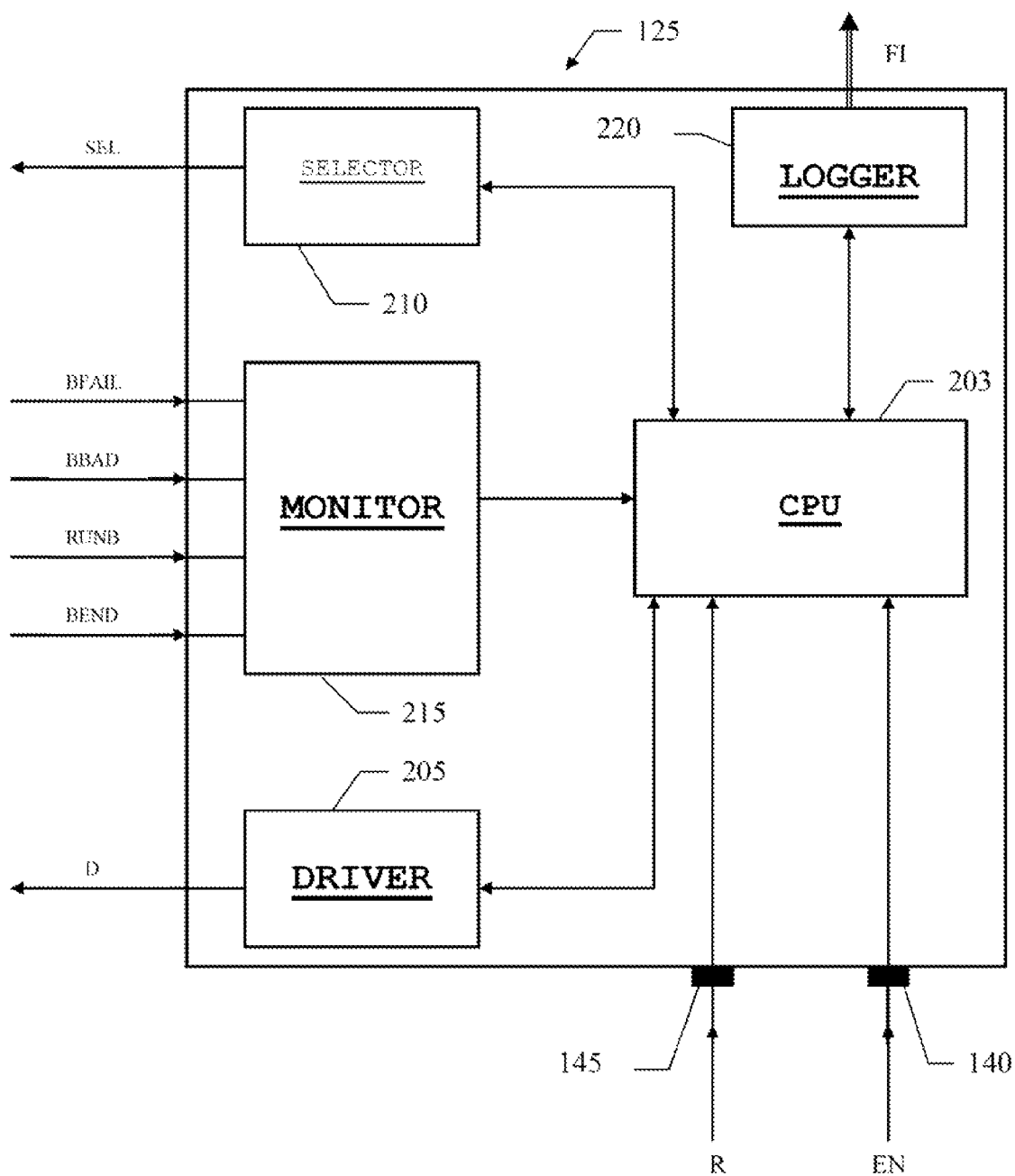
FIG. 2 is a simplified block diagram of a microcontroller of an electronic device according to an embodiment.

Referring now to FIG. 2, there is shown a simplified block diagram of the microcontroller 125 according to an embodiment.

The microcontroller 125 includes a CPU (Control Processing Unit) 203, which performs processing operations, as well as synchronization and coordination operations among the various functional blocks being included in the microcontroller 125; the CPU 203 receives the signal EN (at the pin 140) and the signal R (at the pin 145)

The CPU 203 controls a driver 205, which provides the signal D to the BIST machine (not shown in the figure).

The CPU 203 also controls a selector 210, which provides the signal SEL to the multiplexer (not shown in the figure).

The microcontroller 125 also includes a monitor 215, which monitors the signals BFAIL, BBAD, BEND and RUNB being received by the BIST machine; the monitor 215 also interfaces with the CPU 203, to which it provides such signals for their next processing.

Furthermore, the CPU 203 interfaces with a logger 220, which controls the writing and reading of the failure information in the memory (not shown in the figure).

Figure 3:
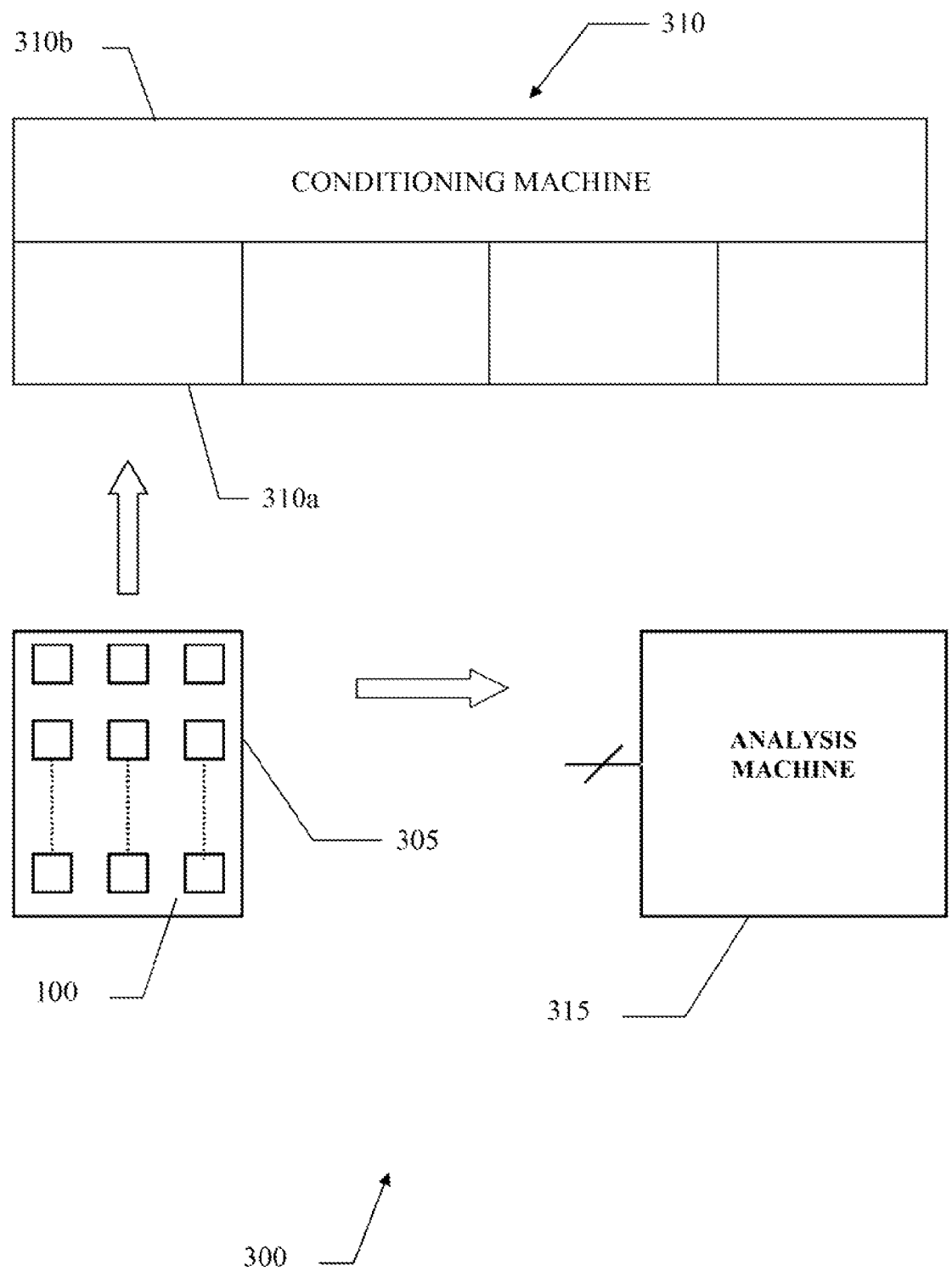
FIG. 3 is a schematic representation of a test apparatus according to an embodiment.

Turning now to FIG. 3, there is shown a schematic representation of a test apparatus 300 according to an embodiment.

The test apparatus 300 is used for performing reliability tests of batches of electronic devices 100. To such purpose, the electronic devices 100 are (reversibly) mounted on test cards 305 (only one shown in the figure). The test apparatus 300 includes a conditioning machine 310 for performing a conditioning procedure on the electronic devices 100; in particular, such conditioning machine 310 is provided with a thermal section 310a (for example, a furnace); the thermal section 310a subjects the electronic devices 100 being mounted on the test cards 305 to heat stress conditions (for example, at very high or very low temperatures). The conditioning machine 310 is also provided with a control section 310b, which subjects the electronic devices 100 being mounted on the test cards 305 to voltage stress conditions (for example, at very high voltages). Furthermore, the control section 310b activates the operation of the electronic devices 100 (during the conditioning procedure) by providing the enable signal EN to all the electronic devices 100 (to allow the corresponding microcontrollers driving the execution of several test cycles by the corresponding BIST machines).

The test apparatus 300 further includes an analysis machine 315 for reading the failure information (stored in the memories of the electronic devices 100 of a specific test card 305) at the end of the conditioning procedure.

It is noted that an embodiment may be implemented without any change in the conditioning machine 310 (since the same signal being already available for causing the BIST machines to execute the test cycles is now used to activate the microcontrollers). In fact, all the operations (for storing the failure information) are managed within the electronic devices 100 (by the corresponding microcontrollers). In such a way, an embodiment may directly be applied to any existing conditioning machine. Moreover, the analysis machine 315 is independent of the conditioning machine 310; therefore, the reading of the failure information may also be performed in separated locations with respect to the conditioning procedure (for example, for analyzing failures that occurred at a customer site by a producer).

Figure 4:
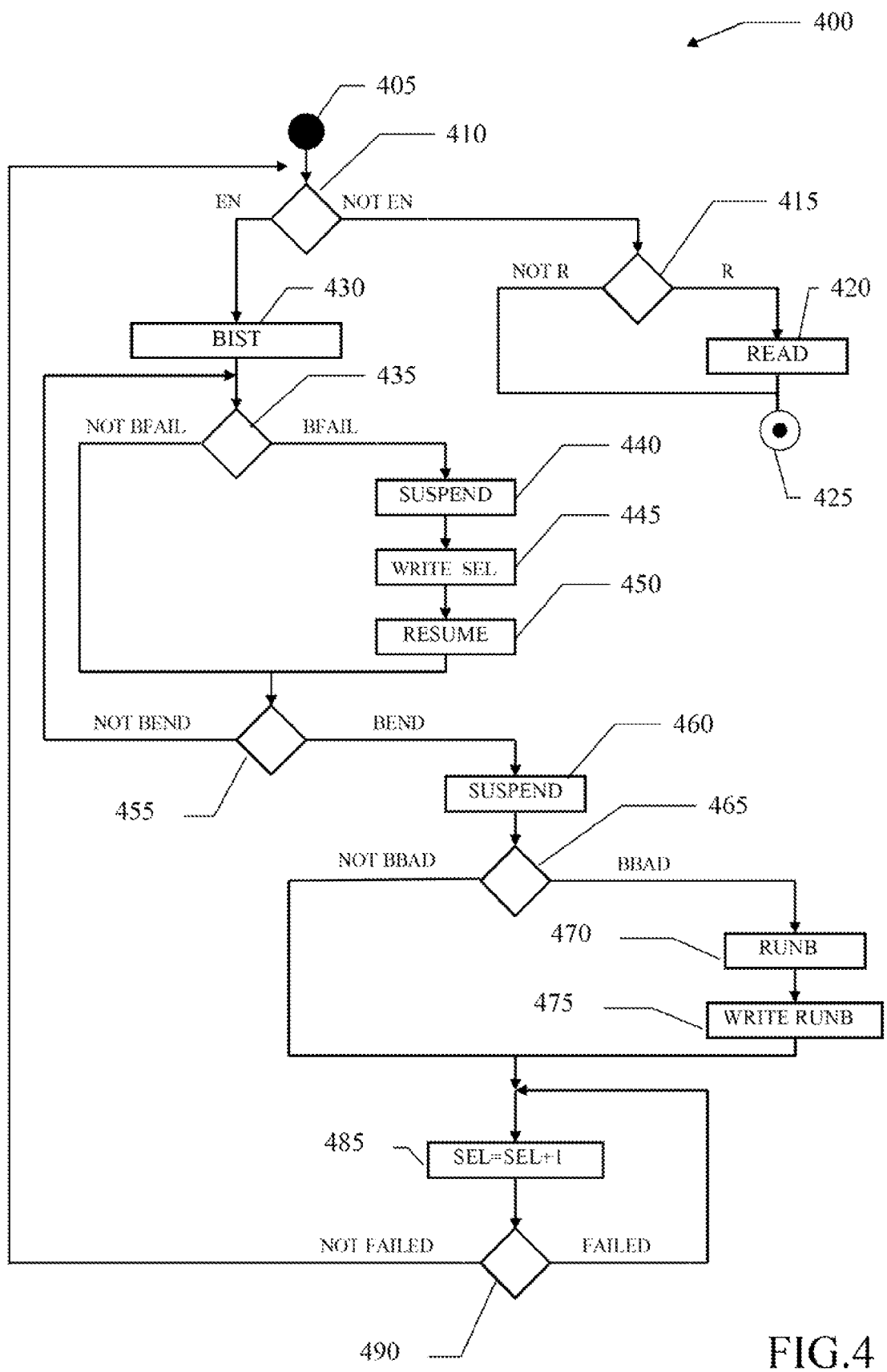
FIG. 4 is a simplified activity diagram of the flow of operations being performed by a microcontroller according to an embodiment.

Referring now to FIG. 4, there is shown a simplified activity diagram of the flow of operations being performed by the microcontroller 125 according to an embodiment. Such operations are performed under the control of a corresponding software program, which is stored in a mass memory of the microcontroller (for example, a ROM), and loaded (at least partly) into a working memory thereof (for example, a RAM) when the program is running.

The program may implement an embodiment of a method 400, which begins at the starting black circle 405.

A test is then performed at the block 410 for determining the progress state of the conditioning procedure of the electronic device; if such procedure has ended (as indicated by the signal EN being de-asserted—for example, at the logical level "0"), then a new test is performed at the block 415 for determining if the reading of the failure information from the memory has been requested (as indicated by the signal R being asserted—for example, at the logical value "1"). In the affirmative case, the operation flow reaches the block 420, in which the microcontroller commands the sending of the failure information being stored in the memory in succession to the corresponding output terminal; once the request has been satisfied, the operation flow ends at the ending double circle 425; instead, if the test being performed at the decision block 415 provides a negative result since no request of reading the failure information occurred (signal R being de-asserted), the method directly proceeds to the ending double circle 425.

Returning to the decision block 410, if the result of the test is affirmative, since the conditioning procedure has not ended yet (signal EN being asserted), then the microcontroller activates the BIST machine by asserting the signal D (with the signal SEL that is initialized to a starting value—for example, SEL=0) so as to activate the execution of the test operation of the MUT being addressed by the multiplexer (corresponding to the signal SEL).

The method 400 then proceeds to the block 435, wherein the microcontroller checks if a failure of the current MUT has been detected; such failure is reported by the signal BFAIL, which provides a pulse when the failure occurs.

If the result of such decision block is affirmative (signal BFAIL being asserted), at block 440 the microcontroller temporarily suspends the BIST machine by de-asserting the signal D. In this way, it is avoided that the test operation of the current MUT ends before the execution of the operations that will be described below; this allows saving more pieces of failure information of the same MUT in a same test operation. This may be useful, for example, when it is desired to validate the failure of a MUT only after more than one (for example, two) signals BFAIL are asserted, so as to exclude that a transient failure (for example, being due to errors of the BIST machine) is interpreted as a damage of the MUT.

Once the operation at the block 440 has ended, the microcontroller allocates a new entry in the memory for the failure that has just been detected, by writing the value of the signal SEL into it so as to identify the damaged MUT. In such way, for each failure it is possible to obtain indications about the specific MUT being involved (in order to further facilitate its analysis).

The microcontroller then re-activates the BIST machine at the block 450.

The method thus continues to the decision block 455.

The same point is reached directly from the decision block 435 if no failure of the MUT has been detected (signal BFAIL being de-asserted).

In such phase, the microcontroller checks whether the test operation of the MUT has ended. In the negative case (as indicated by the signal BEND being de-asserted), the activity flow returns to the block 435 for repeating the same operations described above until the test operation of the MUT has ended.

As soon as this occurs (signal BEND being asserted), the microcontroller suspends the BIST machine at the block 460 by de-asserting the signal D. The microcontroller then checks at the block 465 if a failure has occurred during the test operation, as indicated by the signal BBAD that is asserted (and maintained as it is) as soon as a failure has been detected (signal BFAIL being asserted).

In the affirmative case (signal BBAD being asserted), the microcontroller at the block 470 acquires the information, being contained in the signal RUNB that is provided by the BIST machine, about the progressive number of test operations (in all the test cycles) that the BIST machine has performed.

The information thus obtained is stored by the microcontroller in the corresponding entry of the memory at the block 475 for completing the respective failure information.

At this point the activity flow passes to the block 485; the same point is reached directly from the block 465 if no failure has been detected (signal BBAD being de-asserted).

In such phase, a loop of operations is executed for updating the signal SEL, so as to couple the BIST machine with a new MUT. Such result is obtained by increasing the value of the signal SEL by one unit (in module equal to a maximum value corresponding to the total number of MUTs in the electronic device).

Continuing to the block 490, the microcontroller checks whether at least one entry of the memory includes such signal SEL (indicating that a previous test operation on the corresponding MUT has failed). If such condition is satisfied, the method returns to the block 485 (for increasing the signal SEL again). Conversely, the activity flow continues to the block 410 to perform the test operation on a new MUT being selected by the signal SEL thus obtained.

In this way, the MUTs that have been affected by a failure are no more subject to any test operations (during a subsequent test cycle, if provided); this prevents wasting processing power unnecessarily by the electronic device for retesting a MUT being already identified as defective.

Naturally, in order to satisfy local and specific requirements, a person skilled in the art may apply to the embodiments described above many logical and/or physical modifications and alterations. More specifically, although the present disclosure has been described with a certain degree of particularity with reference to preferred embodiments thereof, it is understood that various omissions, substitutions and changes in the form and details as well as other embodiments are possible. Particularly, a same embodiment may even be practiced without the specific details set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any disclosed embodiment may be incorporated in any other embodiment as a matter of general design choice.

For example, similar considerations apply if the electronic device has a different architecture or includes equivalent components (either separated from each other or combined together, in whole or in part); in particular, it may be possible to provide any number (one or more) of microcontrollers and/or auxiliary memories in order to speed up some or all of the operations of the above-described method, for example, by managing them in parallel mode.

Moreover, the proposed system may be used in any reliability test; in particular, the reliability test may be based on the burn-in procedure, or on any conditioning procedure acting under different and/or additional stress conditions (for example, current, pressure, and the like).

Analogous considerations apply if the electronic device includes any number (one or more) of memories to be tested.

Moreover, different test cycles may be performed, each one including any number and type of test operations (for example, each one for testing a memory cell).

Besides, it is not excluded that the microcontroller might include further functional blocks inside it, with respect to those cited in the description, or that it might be provided with different functional blocks.

The timing information of the failed test operation may be provided in a different way from the number of the test operations (for example, by a clock signal within the microcontroller). Alternatively, the timing information may be provided by different numbers, for example a first number indicating the number of the test operation within a corresponding test cycle, and a second number indicating the number of the test cycle.

Moreover, nothing prohibits performing the test operation concurrently on more MUTs (for example, two at a time) in order to speed up testing, in such case providing further control means for managing the operations.

Furthermore, the failure information may include possible other identifications of the failed MUTs—for example, a code thereof (although such feature is not strictly necessary and it may be omitted in a simplified implementation).

Nothing prevents suspending the functional test of the MUTs only after a minimum number of failures, up to never.

The same considerations may be extended to the case in which the elements to be tested are of different types.

Moreover, similar considerations apply if the memory being used to save the failure information is outside the electronic device (for example, when it is made in a technology that does not provide for the integration of such components).

Similar considerations are valid if the functional test is not executed by a BIST machine, but by any other circuit being adapted to perform equivalent functions.

Similar considerations apply if the test apparatus has a different structure or includes equivalent components.

In any case, there is not excluded the possibility of modifying the conditioning machine in order to perform an embodiment of the described method completely inside it.

An embodiment lends itself to be implemented with an equivalent method (by using similar steps, removing some steps being non-essential, or adding further optional steps); moreover, the steps may be performed in a different order, concurrently or in an interleaved way (at least in part).

The proposed structure might be part of the design of an integrated circuit. The design may also be created in a programming language; moreover, if the designer does not fabricate chips or masks, the design may be transmitted by physical means to others. In any case, the resulting integrated circuit may be distributed by its manufacturer in raw wafer form, as a bare die, or in packages. Moreover, an embodiment of the above-described testing circuits may be integrated with other circuits in the same chip, or it may be mounted in intermediate products (such as mother boards) and coupled with one or more other chips (such as a processor or a memory). In any case, the integrated circuit is suitable to be used in complex systems (such as computers).

Similar considerations may apply if the program (that may be used to implement an embodiment) is structured differently, or if additional modules or functions are provided. In any case, the program may take any form suitable to be used by the microcontroller or in connection therewith. Moreover, it may be possible to provide the program on any medium being usable by it. In any case, an embodiment may lend itself to be implemented even with a hardware structure, or with a combination of software and hardware.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An electronic device; comprising:
an integrated circuit chip including:
a plurality of functional elements for implementing a functionality of the electronic device;
testing means for executing a test of the functional elements including a plurality of test operations on the functional elements, the testing means returning an indication of a result of each test operation;
control means for causing the testing means to reiterate the test;
monitoring means for monitoring the result of each test operation to detect a failure by the functional element of the test operation; and
storage means for storing failure information indicative of temporal characteristics of each failure and indicative of identity characteristics of the functional element that failed the test operation.

2. The electronic device according to claim 1, wherein the failure information includes a progressive number of the corresponding test.

3. The electronic device according to claim 1, wherein each test operation is executed on a single one of the functional elements, the failure information identifying the corresponding functional element which failed the test operation.

4. The electronic device according to claim 1, further including means for stopping the reiteration of the test operation of each functional element in response to the failure of the functional element.

5. The electronic device according to claim 1, wherein the functional element includes at least one memory.

6. The electronic device according to claim 1, wherein the storage means includes a further non-volatile memory integrated in the integrated circuit chip.

7. The electronic device according to claim 1, wherein the testing means includes a Built-In Self Test machine.

8. A test apparatus for executing a reliability test on a plurality of electronic devices, each electronic device comprising:
an integrated circuit chip including:
a plurality of functional elements for implementing a functionality of the electronic device;
testing means for executing a test of the functional elements including a plurality of test operations on the functional elements, the testing means returning an indication of a result of each test operation;

control means for causing the testing means to reiterate the test;

monitoring means for monitoring the result of each test operation to detect a failure by the functional element of the test operation; and storage means for storing failure information indicative of temporal characteristics of each failure and indicative of identity characteristics of the functional element that failed the test operation;

the test apparatus including:

enabling means for enabling the control means of each electronic device in response to a start of the reliability test, and for disabling the control means of each electronic device in response to a completion of the reliability test, and reading means for reading the failure information from the storage means of each electronic device.

9. The apparatus according to claim 8, wherein the apparatus includes a conditioning machine including the enabling means and a distinct reading machine including the reading means.

10. An integrated circuit chip, comprising:
a functional circuit including a plurality of functional elements;
a test circuit configured to cause each functional element of the functional circuit to undergo a first test at a test time, to provide a result of the test, and to provide an indication of the test time; and
a controller configured to store the test result and the indication of the test time if the functional element fails the test and configured to store identification information of the functional element which failed the test in conjunction with the test result.

11. The integrated circuit chip of claim 10 wherein each functional element comprises a memory cell.

12. The integrated circuit chip of claim 10 wherein the test circuit comprises a built in self test circuit.

13. The integrated circuit chip of claim 10 wherein the indication of the test time is relative to a time of at least one other test.

14. The integrated circuit chip of claim 10 wherein the indication of the test time is a number indicating a location of the test within a group of tests.

15. The integrated circuit chip of claim 10 wherein:
the test circuit is configured to cause the functional element to undergo a second test; and
the controller is configured to prohibit the functional element from undergoing the second test if the functional element failed the first test.

16. The integrated circuit chip of claim 10 wherein the controller is configured to select the functional element to undergo the test.

17. The integrated circuit chip of claim 10 wherein the controller is configured to store the test result and the indication of the test time only if the functional element fails the test.

18. The integrated circuit chip of claim 10 wherein the controller is operable to store the test result in a memory disposed outside of the integrated circuit chip.

19. The integrated circuit chip of claim 10, further comprising:
a memory; and the controller is configured to store the test result in the memory.

20. A method, comprising:
causing a functional circuit on an integrated circuit chip to undergo a first test at a test time with a test circuit disposed on the integrated circuit, wherein the functional circuit comprises a plurality of functional elements; and
storing a result of the test and an indication of the test time and an indication of an identification of the functional element of the functional circuit that fails the test with a controller disposed on the integrated circuit chip.

21. The method of claim 20 wherein the indication of the test time is relative to a time of at least one other test.

22. The method of claim 20, further comprising:
causing the functional element to undergo a second test with the test circuit; and
prohibiting the functional element from undergoing the second test with the controller if the functional element failed the first test.

23. The method of claim 20, further comprising selecting with the controller the functional element to undergo the test.

24. The method of claim 20 wherein storing comprises storing the test result and the indication of the test time only if the functional element fails the test.

25. The method of claim 20 wherein storing comprises storing the test result in a memory disposed outside of the integrated circuit.

26. The method of claim 20 wherein storing comprises storing the test result in a memory disposed in the integrated circuit.

27. A tangible computer readable medium operable to store programming instructions that when executed by a controller on an integrated circuit, are operable to cause the controller:
to cause a functional circuit on an integrated circuit chip to undergo a first test at a test time with a test circuit disposed on the integrated circuit, wherein the functional circuit comprises a plurality of functional elements; and
to store a result of the test and an indication of the test time and an indication of an identification of the functional element of the functional circuit that fails the test.

28. A testing apparatus, comprising:
a conditioner configured to cause an integrated circuit chip to experience a test condition;
wherein the integrated circuit chip comprises a functional circuit including a plurality of functional elements and a testing circuit configured to test operation of each of the functional elements; and
an analyzer configured to receive from the testing circuit of the integrated circuit chip an identification of the functional element of the functional circuit on the integrated circuit that fails a test during the test condition and a time of the failed test.

29. The testing apparatus of claim 28 wherein the test condition comprises a voltage stress condition.

30. The testing apparatus of claim 28 wherein the test condition comprises a temperature condition.

31. The testing apparatus of claim 28, further comprising an enable circuit configured to enable the integrated circuit chip to be tested.

* * * * *